United States Patent [19]

Watanabe et al.

[11] Patent Number: 4,623,853

[45] Date of Patent: Nov. 18, 1986

[54] SURFACE ACOUSTIC WAVE DISPERSIVE DELAY LINES HAVING A LASER IRRIDATED FOCUS AREA FOR ELIMINATING UNDESIRED SAW CONCENTRATIONS

[75] Inventors: Takaya Watanabe; Toshihiko Kitano, both of Tokyo, Japan

[73] Assignee: NEC Corporation, Tokyo, Japan

[21] Appl. No.: 574,552

[22] Filed: Jan. 27, 1984

[30] Foreign Application Priority Data

Jan. 31, 1983 [JP] Japan .................................. 58-14192

[51] Int. Cl.⁴ ............................................ H03H 9/44
[52] U.S. Cl. ..................................... 333/151; 333/195; 310/313 D
[58] Field of Search ............... 333/150, 151, 154, 153, 333/193-195; 310/313 R, 313 A, 313 B, 313 C, 313 D

[56] References Cited

U.S. PATENT DOCUMENTS

| | | | |
|---|---|---|---|
| 3,697,899 | 10/1972 | Dias ........................... | 310/313 B X |
| 3,818,379 | 6/1974 | Wauk, II ....................... | 333/151 |
| 3,883,831 | 5/1975 | Williamson et al. ............... | 333/153 |
| 3,893,047 | 7/1975 | Lardat ......................... | 333/153 |
| 3,938,881 | 2/1976 | Biegelsen et al. .............. | 310/313 B X |
| 3,975,697 | 8/1976 | Paige .......................... | 333/153 |
| 4,047,130 | 9/1977 | Lim et al. ...................... | 333/144 |

FOREIGN PATENT DOCUMENTS

| | | | |
|---|---|---|---|
| 0021548 | 2/1978 | Japan ................................... | 333/151 |
| 0072516 | 6/1981 | Japan ................................... | 333/155 |
| 0057021 | 4/1982 | Japan ................................... | 333/195 |
| 1484859 | 9/1977 | United Kingdom ................ | 333/150 |

OTHER PUBLICATIONS

Anderson A. C. et al, "Attenuating Thin Films for SAW Device" *1980 Ultrasonic Synposian Proceeding;* Boston, Mass.; Nov. 5-7, 1980 pp. 442-443.

*Primary Examiner*—Eugene R. LaRoche
*Assistant Examiner*—Benny Lee
*Attorney, Agent, or Firm*—Laff, Whitesel, Conte & Saret

[57] ABSTRACT

In a surface acoustic wave dispersive delay line of the type comprising a substrate made of piezoelectric material along which surface acoustic wave propagates, an input transducer formed on the substrate for producing the surface acoustic wave in response to an input electric signal, a first reflector including a plurality of reflection gatings formed at different spacings on the substrate for reflecting the surface acoustic wave from the input transducer, a second reflector including a plurality of reflection gratings formed at different spacings on the substrate for reflecting the surface acoustic wave reflected by the first reflector, an output transducer for converting the surface acoustic wave reflected by the second reflector into an electric signal, there is provided a device for eliminating concentration of the surface acoustic wave formed by the first and second reflectors. The concentration eliminating device comprises a coating of a conductive composition or a silicon rubber applied on a focus at which the surface wave concentrates or is formed by irradiating the focus with a laser beam.

1 Claim, 4 Drawing Figures

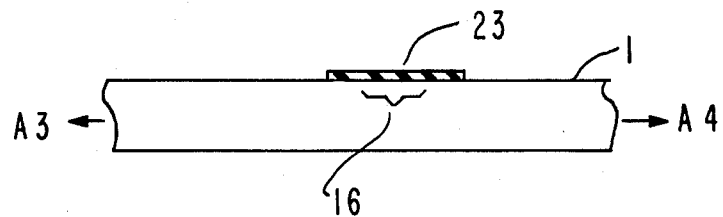
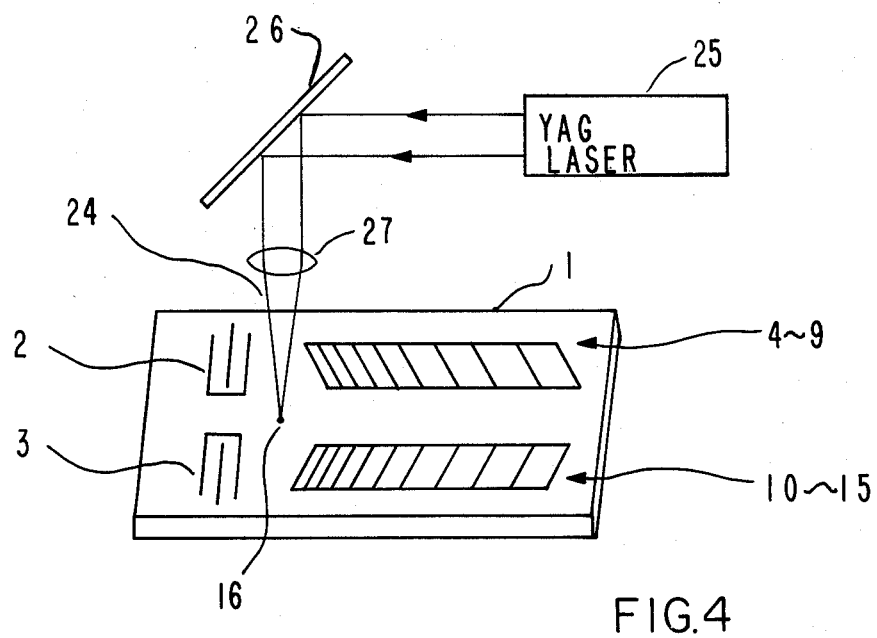

SURFACE ACOUSTIC WAVE DISPERSIVE DELAY LINES HAVING A LASER IRRIDATED FOCUS AREA FOR ELIMINATING UNDESIRED SAW CONCENTRATIONS

BACKGROUND OF THE INVENTION

This invention relates to a reflection grating type surface acoutic wave dispersive delay line.

As is disclosed in U.S. Pat. No. 3,883,831, the prior art dispersive type delay line is constituted by an input transducer for generating surface acoustic waves, a first reflector made up of a plurality of reflection gratings that reflect surface acoustic waves radiated from the input transducer in an orthogonal direction, a second transducer made up of a plurality of reflection gratings which reflect again the reflected waves in an orthogonal direction, and an output transducer which converts the surface acoustic waves reflected by the second reflector into the original electric signal. In the reflection grating type surface acoustic wave dispersive delay line of this type, however, there is a defect that the amplitude of the electric signal converted at the output transducer overshoots onthe side of the pass bandwidth of the frequency/amplitude characteristic. Furthermore, near a frequency at which the overshooting occurs, delay time and phase of the output electric signal varies greatly.

SUMMARY OF THE INVENTION

It is an object of this invention to provide an improved reflection grating type surface acoustic waves dispersive delay line that can eliminate the defect described above and has excellent amplitude, phase and delay characteristics.

According to this invention, there is provided an electric surface wave dispersion type delay line comprising a substrate along which elastic surface waves propagate; an input transducer formed on the substrate for producing the elastic surface waves in response to an input electric signal; a first reflector including a plurality of reflection gratings formed at different spacings on the substrate for reflecting the surface acoustic waves from the input transducer; a second reflector including a plurality of reflection gratings formed at different spacings on the substrate for reflecting the surface acoustic waves reflected by the first reflector; an output transducer for converting the surface acoustic waves reflected by the second reflector into an electric signal; and means for eliminating concentration of the surface acoustic waves formed by the first and second reflectors.

The concentration eliminating means is formed by coating a conductive composition or a silicon rubber on a focal point or focus at which the surface acoustic waves concentrate or by irradiating the focal point with a laser beam.

BRIEF DESCRIPTION OF THE DRAWING

In the accompanying drawing:

FIG. 3 is an enlarged sectional view taken along the line A3–A4 in FIG 1; and

FIG. 4 is a perspective view showing another embodiment fo the present invention using a laser beam.

DESCRIPTION OF THE PREFERRED EMBODIMENT

The principle of this invention will be described first. The delay line of this invention is based on the following principle. More particularly, in a metal grating type dispersive delay line comprising a plurality of reflection gratings, the surface acoustic waves impinging upon the reflection gratings ideally follow Snell's law when mode conversion is neglected. Actually, however, since the piezoelectric substrate used has anisotropic properties, the surface acoustic waves are radiated in all directions instead of in an orthogonal direction at a portion where the wavelength of the surface acoustic waves coincides with the pitch (spacing between adjacent reflection gratings) of a plurality of reflection gratings.

For this reason, a plurality of reflection gratings having different pitches and successively juxtaposed operate like a Fresnel lens, thus concentrating the surface acoustic waves to a specific point along the propagation path of the surface acoustic waves with the result that the amplitude and phase of the propagating surface acoustic waves are disturbed. This invention contemplates elimination of the focal point of the wavefront acting as a lens. In other words, according to this invention, means are provided to prevent concentraction of the surface acoustic waves to the point at which the characteristic is disturbed.

Figure 1:
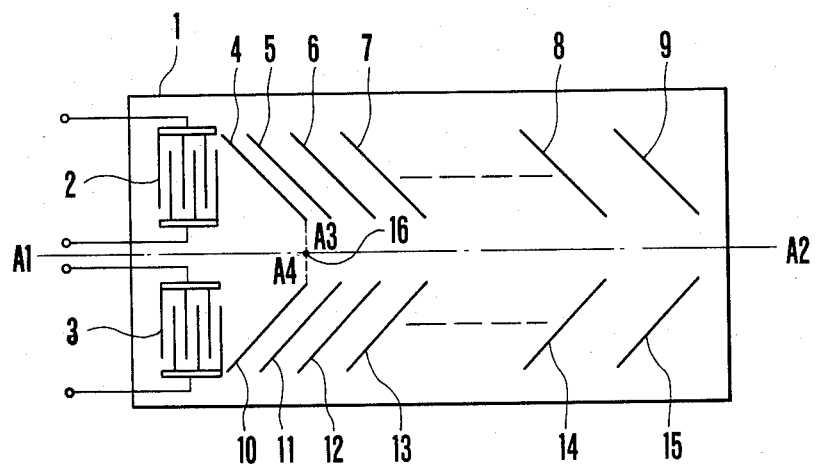
FIG. 1 is a diagrammatic representation of one embodiment of the surface acoutic wave dispersive delay line according to this invention.

A preferred embodiment of the surface acoustic waves dispersive delay line of this invention shown in FIG. 1 comprises a piezoelectric substrate 1 made of lithium niobate ($LiNbO_3$), quartz ($SiO_2$) or bimuth germanium oxide ($Bi_{12}GeO_{20}$). An input transducer 2 converts an input electric sigal into surface acoustic waves, while an output transducer 3 converts the surface acoustic waves back into the electrical signal. Each of the input and output transducers 2 and 3 is constituted by interdigital electrodes. Reflection gratings 4 through 9 are used to bend the surface acoustic waves in the orthogonal direction and is made of a metal such as aluminum or of an oxide thereof. Reflection gratings 10 through 15 are in axial symmetry with the reflection gratings 4 through 9 with respect to a phantom axis A1–A2 (a line interconnecting the cross-points of the reflection gratings 10 through 15 and 4 through 9). It was confirmed by experiment (as described later) that the mid point 16 of a phantom axis A3–A4 correspond to a focal point or focus. In the dispersive delay line having the construction described above, when surface acoustic waves are radiated from the input transducer 1, the surface acoustic waves propagates through reflectors 4 to 9 and a portion of the propagating surface acoustic waves sharply reflect in the orthogonal direction at a point at which the wavelength of the surface acoustic waves and the distance between the adjacent reflection gratings (reflector pitch) coincide with each other. The propagating surface acoustic waves are reflected again in the orthogonal direction at the reflection gratings 10 to 15 to reach the output transducer 3. However, owing to the anisotropic property of the piezoelectric substrate for the surface acoustic waves, a portion of the surface acoustic waves concentrate at the center point of the phantom axis A3–A4. Consequently, an overshooting phenomenon as shown at 21 in FIG. 2 appears in the delay characteristic of the output electric signal near a point 22 on a higher frequency side of the passband of the frequency/amplitude characteristic. For example, result of an experiment using a prior art device having the following dimension indicates that the focal point is located at the midpoint 16, described above, and has a size of 20 to 100 micron in diameter.

Size of BGO substrate: 20×50×1 mm;

Thickness of aluminum film for the transducers 2 and 3 and reflection gratings 4–15: 1000 angstroms;

Distance between transducers 2 and 3 and reflection gratings 4–9 and 10–15, respectively: 9 mm;

Fingers of the transducers 2 and 3: 20 pairs;

Aperture length of the transducer 2 and 3: 5 mm;

The number of the reflection gratings: 2000 (with 2 micron to 100 micron strip width).

Figure 2:
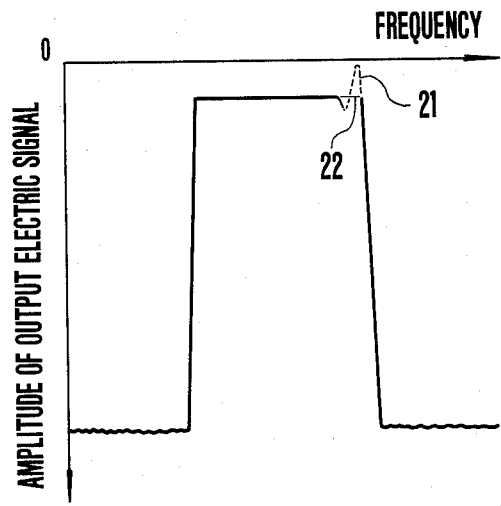
FIG. 2 shows the frequency/amplitude characteristic of the delay line shown in FIG. 1.

It was verified that the overshooting phenomenon as shown in FIG. 2 was eliminated by coating the focal point with conductive bonding agent (Dupont 5504A) or silicon resin or by irradiating a YAG laser beam on the focal point.

As shown in FIG. 3, the surface acoustic wave absorbing member 23 is deposited on the surface of the substrate 1 so that the focal area 16 is entirely covered by the member 23. For this reason, according to the delay line of this invention, surface acoustic waves absorbing member 23 made of a conductive composition or a silicon rubber is coated on the mid point of the phantom axis A3–A4 for eliminating an oveshooting of the amplitude of the output electric signal caused by the surface waves concentrating to the mid point or focal point 16. Preferably, the elastic surface wave absorbing member 23 is made of such a sound absorbing material as a conductive composition agent or a silicon rubber. FIG. 4 shows another embodiment of the delay line according to the present invention wherein the focal point is irradiated by laser beam. Instead of coating the surface acoustic waves absorbing material, a portion 16 of the substrate 1 at which the focus is formed can be irradiated with a laser beam 24 which is emitted from a YAG laser 25, reflected by a mirror 26 and concentrated by a lens 27, for disturbing the propagation of the surface acoustic waves.

As described above, according to this invention, the overshooting of the output electric signal in the delay characteristic can be efficiently prevented by a simple measure of applying surface acoustic waves absorbing material to the focus at which the surface waves concentrate or by irradiating the focus with a laser beam. It should be understood that this invention is also applicable to a group reflector structure formed by ion beam etching in addition to the reflector of metal reflection gratings.

What is claimed is:

1. A surface acoustic waves dispersive delay line comprising:

a piezoelectric substrate along which surface acoustic waves propagates;

an input transducer formed on said substrate for producing said surface acoustic waves in response to an input electrical signal;

a first reflector including a plurality of reflection gratings formed at different spacings on said substrate for reflecting the surface acoustic waves from said input transducer;

a second refector including a plurlaity of reflection gratings formed at different spacings on said substrate for reflecting the surface acoustic waves reflected by said first reflector;

an output transdcer for converting the surface acoustic waves reflected by said second reflector into an output electrical signal; and means for eliminating a concentration of said surface acoustic waves which naturally tend to form at an area of focus responsive to reflections from said first and second reflectors, wherein said concentration eliminating means is formed by irradiating with a laser beam a focus area on the surface of the substrate at which the surface acoustic waves concentrate.

* * * * *